United States Patent [19]

Fox

[11] Patent Number: 5,184,211
[45] Date of Patent: Feb. 2, 1993

[54] APPARATUS FOR PACKAGING AND COOLING INTEGRATED CIRCUIT CHIPS

[75] Inventor: Leslie R. Fox, Boxborough, Mass.

[73] Assignee: Digital Equipment Corporation, Maynard, Mass.

[21] Appl. No.: 485,850

[22] Filed: Feb. 22, 1990

Related U.S. Application Data

[63] Continuation of Ser. No. 162,671, Mar. 1, 1988, abandoned.

[51] Int. Cl.[5] .................... H01L 23/12; H01L 23/24; H01L 23/34
[52] U.S. Cl. .................................. 257/706; 257/707; 257/713; 257/678; 257/718; 257/717; 257/731
[58] Field of Search ................ 357/70, 80, 81, 74, 357/82

[56] References Cited

U.S. PATENT DOCUMENTS

| | | |
|---|---|---|
| 3,234,451 | 2/1966 | Diebold . |
| 4,012,768 | 3/1977 | Kirk et al. ............... 357/81 |
| 4,233,645 | 11/1980 | Balderes et al. . |
| 4,251,852 | 2/1981 | Ecker et al. ............. 357/81 |
| 4,442,450 | 4/1984 | Lipschutz et al. . |
| 4,459,607 | 7/1984 | Reid ...................... 357/70 |
| 4,521,829 | 6/1985 | Wessely . |
| 4,561,011 | 12/1985 | Kohara et al. ........... 357/81 |
| 4,626,960 | 12/1986 | Hamano et al. .......... 357/80 |
| 4,639,829 | 1/1987 | Ostergren et al. ........ 357/79 |
| 4,651,192 | 3/1987 | Matsushita et al. ....... 357/80 |
| 4,703,339 | 10/1987 | Matsuo ................... 357/80 |
| 4,715,115 | 12/1987 | King et al. .............. 357/70 |
| 4,729,010 | 3/1988 | Tsuchiya et al. ......... 357/70 |
| 4,742,385 | 5/1988 | Kohmoto ................. 357/70 |
| 4,803,546 | 2/1989 | Sugimoto et al. ........ 357/80 |
| 4,812,949 | 3/1989 | Fontan et al. ........... 361/386 |

FOREIGN PATENT DOCUMENTS

| | | |
|---|---|---|
| 0068142 | 1/1983 | European Pat. Off. . |
| 0103068 | 3/1984 | European Pat. Off. . |
| 3803469 | 8/1989 | Fed. Rep. of Germany . |
| 58-56445 | 4/1983 | Japan ..................... 357/81 |
| 0219942 | 12/1984 | Japan ..................... 357/81 |
| 59-219942 | 12/1984 | Japan . |
| 61-4255 | 1/1986 | Japan ..................... 357/81 |
| 61-61449 | 3/1986 | Japan ..................... 357/81 |
| 62-9640 | 1/1987 | Japan . |
| 0136865 | 6/1987 | Japan ..................... 357/80 |
| 0276862 | 12/1987 | Japan ..................... 357/74 |
| 7610306 | 3/1978 | Netherlands ............. 357/70 |

OTHER PUBLICATIONS

Arnold et al., "Thermally enhanced module for self-contained data processing package," IBM TDB, vol. 20, No. 5, Oct. 1977, pp. 1766-1767.

(List continued on next page.)

Primary Examiner—Eugene R. LaRoche
Assistant Examiner—Viet Q. Nguyen
Attorney, Agent, or Firm—Jones, Tullar & Cooper

[57] ABSTRACT

A packaging and cooling assembly for integrated circuit chips includes a base for reception of one or more circuit chips, and a combination heat sink and cover for attachment to the base. The circuit chips are mounted circuit side down on the base, and include flexible lead frames for attachment to bonding pads on the base. Compliant cushions that generally conform to the shape and size of the chips are held loosely between the circuit sides of the chips, and the base. The heat sink enages the back sides of the circuit chips when it is attached to the base. This causes the chips to compress the compliant cushions, thereby holding the chips firmly in position, and forming a high thermal conductivity interface between the chips and the heat sink. To further enhance the heat transfer characteristics of the interface, a thin film of fluid is coated on the back sides of each chip to fill in the microvoids which result from asperity contact of the heat sink and chip mating surfaces. A sealing gasket is provided between the heat sink and the base to form a protective enclosure for the chips. Intermediate housings or heat spreader structures may alternatively be disposed between the chips and the heat sink.

20 Claims, 3 Drawing Sheets

OTHER PUBLICATIONS

Arnold et al., "Module with internal elements for reducing thermal resistance", IBM TDB, vol. 21, No. 4, Sep. 1978, pp. 1473–1474.

Johnson, "Integrated circuit semiconductor device package structure", IBM TDB, vol. 19, No. 9, Feb. 1977, pp. 3387–3388.

"Thermally-enhanced tape automated bonded package", IBM TDB, vol. 31, No. 5, Oct. 1988, pp. 34–35.

"Package for decal applications", IBM TDB, vol. 23, No. 5, Oct. 1990, pp. 246–253.

V. Y. Doo et al., "Controlled gap in semiconductor packages", IBM TDB, vol. 20, No. 4, Sep. 1977, p. 1433.

V. Y. Doo et al., "High performance single chip module", IBM TDB, vol. 20, No. 4, Sep. 1977, pp. 1438–1439.

Dombrowskas, "Conduction cooled chip module", IBM TDB, vol. 14, No. 9, Feb. 1972, p. 2689.

IBM T.D.B, vol. 24, No. 11A, pg. 5743, Chu, R. C. et al., Silicon Heat Sink for Semiconductor Chip Apr. 1982.

IBM T.D.B. vol. 24, No. 11A, pp. 5595–5597, Hassan, J. K. et al., Chip Cooling Employing a Conformable Alloy (Apr. 1982).

Ecker, M. E. et al., IBM Technical Disclosure Bulletin, vol. 24, No. 11A, pp. 5625–5626, Apr. 1982.

IBM Technical Disclosure Bulletin, vol. 28, No. 5, pp. 2237–2238, Oct. 1985.

APPARATUS FOR PACKAGING AND COOLING INTEGRATED CIRCUIT CHIPS

This application is a continuation of application Ser. No. 07/162,671, filed Mar. 1, 1988, abandoned.

BACKGROUND OF THE INVENTION

The present invention relates, in general, to a method and apparatus for packaging and cooling Tape Automated Bonding (TAB) type integrated circuit chips.

Removal of heat from integrated circuit (IC) chips is a central problem in modern high performance electronic packaging, requiring careful engineering. Often the well known or standard methods of thermal management are at odds with other package engineering or performance requirements. Incorporation of heat dissipation structures in a circuit chip module often undesirably increases complexity and size of the mechanical structure. The alternative is to design a structure which is usually not very efficient at removing heat from the circuit chips, and thus increases the likelihood of temperature related structural and electrical failures.

A number of different techniques have been proposed to avoid these problems. Usually these techniques involve the use of the chip module housing or package as a heat sink. To insure maximum cooling of the chips contained within the housing, the chips are mechanically connected to the housing or heat sink in a manner so that there is good thermal conductivity between them. This can pose a problem, however, since a rigid mechanical connection between the housing and the circuit chips can cause excessive stress on the chips which could damage them. If, on the other hand, a less rigid mechanical connection is employed, the efficiency of heat transfer from the chips to the heat sink will be reduced, and the probability of chip malfunction due to excessive operating temperature will be correspondingly increased.

Another problem presented by the necessity of coupling the circuit chips to a common heat sink or housing is that the dimensional tolerances from chip to chip on the mounting substrate are such that it is difficult to insure that every chip in the module will be coupled to the housing evenly. Some chips may not even be coupled at all to the housing, while excessive mechanical stress may be imparted to other chips.

There have been proposed a number of solutions in the past to these problems. One such solution is used by IBM in their Thermal Conduction Module for packaging and cooling IC's, and employs captive pistons within the heat sink to contact the chip backside, and accommodate variances in the mechanical features and tolerances. This technique is mechanically complex and therefore costly. Other techniques employ the use of thermally conductive material, such as solder or a thixotropic thermal compound to fill the gap between the chips and the heat sink. These techniques are difficult to implement, and there is little or no compliancy or spring action in the chip-heat sink subsystems to insure close mechanical and thermal contact, and accommodation of dimensional tolerance variations.

The present invention seeks to overcome the disadvantages of the prior techniques.

SUMMARY OF THE INVENTION

It is therefore the object of the present invention to provide an improved method and apparatus for packaging and cooling IC chips in which the chips are held in direct thermal contact with a one piece heat sink without excessive mechanical stress, and without a requirement that the heat sink and chip assembly be constructed in accordance with strict dimensional tolerances.

It is another object of the present invention to provide an efficient cooling structure for electrical circuit chips in which a heat sink also helps form a protective sealed enclosure for the chips.

It is yet another object of the present invention to provide a method and apparatus for cooling electric circuit chips which improves the reliability of the chips through improved thermal management and reduced mechanical and thermal stress.

It is a further object of the present invention to provide a cooling and packaging structure for circuit chips which does not require the chip housings to be bonded to a substrate, and thus permits easy removal of the chips for replacement or reworking.

These and other objects of the invention are attained through the provision of a circuit chip module or assembly which includes a base for supporting a plurality of TAB type IC chips in a circuit side face down manner, and a protective enclosure for attachment to the base which includes a plurality of cooling fins on its top side to permit the enclosure to act as a heat sink. The inner top surface of the heat sink is designed to contact the backsides of the IC chips when the heat sink is in position. Alternatively, the chips can be mounted within separate intermediate protective housings, or include intermediate heat spreader structures, which are then contacted by the heat sink.

The heat sink also includes a peripheral recess on its underside for the reception of a compliant gasket or 0-ring. When the heat sink is positioned on the base, the gasket acts as a sealing ring, and combined with the heat sink and the base, forms a protective enclosure for the IC chips which prevents them from being exposed to external moisture, dirt, etc.

To accommodate variances in the dimensional tolerances of the assembly, a plurality of compliant elastomeric pads or cushions are disposed, one each, between each IC chip and the base. These pads are generally configured to each of the IC chips and can be, for example, circular or rectangular in shape. The IC chips rest on these pads, but are not bonded to them. Instead, flexible circuit lead frames, which lead from each side of the TAB chips to bonding pads on the base substrate, are bonded to the base, and thereby help secure the chips to the same.

When the heat sink is attached to the base, its inside top surface bears on the backsides of the chips, or housings for the same, and causes the cushions beneath the chips to compress slightly. The TAB flexible lead frames permit this vertical movement. As a result, each of the chips is held firmly in position, but without excessive stress. Also, the pressure exerted between the chips and the heat sink due to the compression of the cushions, causes an intimate mechanical contact between each of the chips and the heat sink, which enhances heat transfer between them.

To further enhance heat transfer between the chips and the heat sink, the interface between them is wetted with a very thin film of a non-spreading low vapor pressure fluid, such as a polyphenyl ether or a liquid metal, to fill in the microvoids resulting from asperity contact of the heat sink and chip mating surfaces. Alternatively, a gas filled gap can be employed for this purpose, although the use of a liquid is preferred since it is less sensitive to misalignment and small changes in interface pressure.

The low stress of the separable interface between each chip and the heat sink improves the reliability of the overall structure by reducing the likelihood of thermal stress cracking of the chip, or breaching the passivation moisture barrier through microcracking. Slip freedom of the chip heat sink interface also reduces the tendency of the TAB frame to undergo thermal cycle fatigue induced by thermal mismatches among the various components of the assembly. This, combined with the excellent thermal conductivity characteristics of the interface, and the sealed nature of the enclosure, provides an assembly for IC chips which is relatively simple in construction, and affords the chips a great deal of protection from both thermal and mechanical stress, and external conditions.

BRIEF DESCRIPTION OF THE DRAWINGS

The foregoing and additional objects, features, and advantages of the present invention will be apparent from a consideration of the following detailed description of a preferred embodiment thereof taken in conjunction with the accompanying drawings, in which.

DETAILED DESCRIPTION OF THE PREFERRED EMBODIMENT

Figure 1:
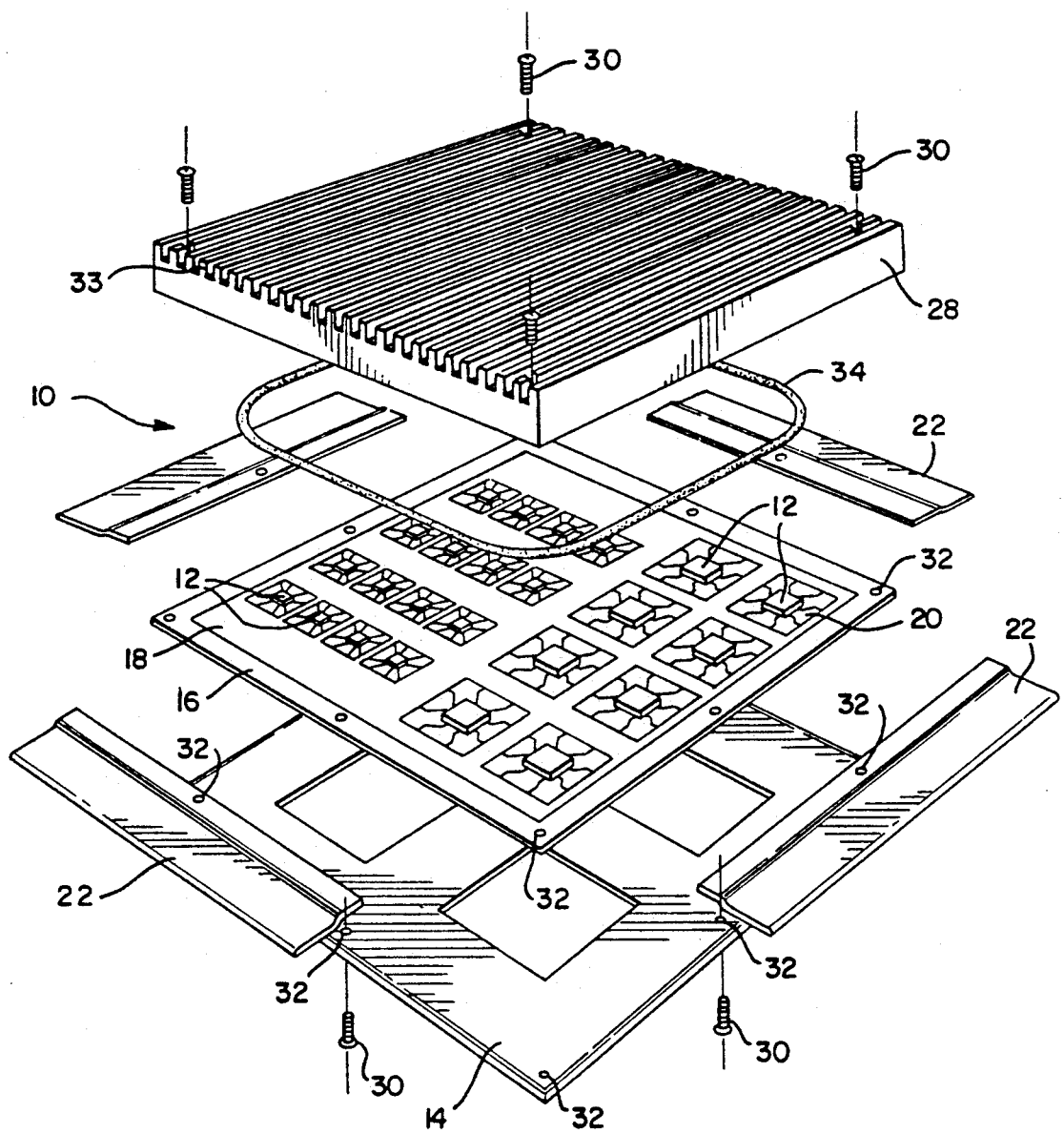
FIG. 1 is a perspective exploded view of an assembly for housing a plurality of IC chips.

Turning now to a more detailed consideration of the invention, there is illustrated in FIG. 1, an assembly 10 for housing a plurality of TAB type IC chip 12. Each of the chips 12, comprises an integrated circuit that is embedded or disposed on a silicon wafer, as is conventional. The assembly includes a base support plate 14, which is preferably constructed either of metal or rigid plastic. Disposed on plate 14 is a conventional ceramic format substrate 16 that includes embedded circuitry (not shown) for supplying power and signals to the IC chips 12. A multilayer thin film substrate 18 is disposed on top of format substrate 16, and also includes a plurality of embedded conductors for supplying power and signals from substrate 16 to a plurality of bonding pads (not shown) which are disposed on top of thin film substrate 18. Each of the TAB type IC chips 12 includes, as is conventional, flexible circuit lead frames 20 that are formed on a thin layer of carrier film, and extend from all sides of the chip. Lead frames 20 are bonded to the bonding pads on thin film substrate 18 to electrically connect, and mechanically secure each of the chips 12 to the same.

A plurality of conventional tape type flexible circuit electrical connectors 22 are attached by means of soldering to the bottom edges of format substrate 16. These connectors supply format substrate 16. These connectors supply power and signals to the circuit chips 12 via format substrate 16, thin film substrate 18, and lead frames 20.

A heat sink and protective cover 28 is secured to format substrate 16 and base support plate 14 with a plurality of screws 30 that are inserted through holes (not shown) in heat sink 28, and a plurality of holes 32 in substrate 16, plate 14 and connectors 22. Heat sink 28 includes a plurality of heat conducting fins 33 disposed on the top thereof, and is preferably made of metal which has good thermal conductivity, and incidentally acts as an electromagnetic shielding means for chips 12. An 0-ring or compliant gasket 34 is disposed between heat sink 28 and format substrate 16 that serves to seal the circuit chips 12 from external dust, water, corrosive gases, etc.

Figure 2:
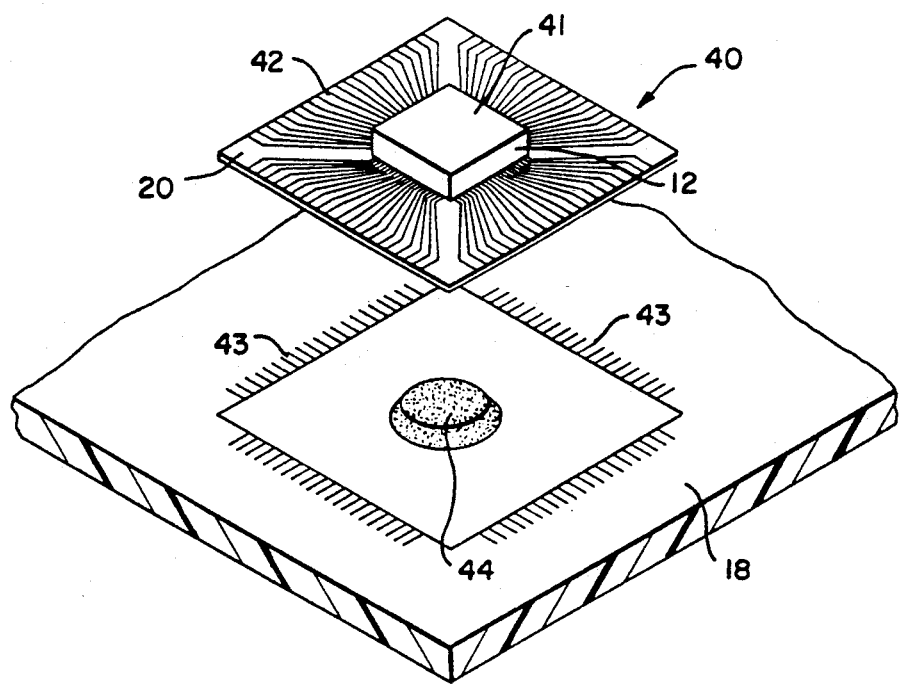
FIG. 2 is a partial perspective exploded view of a TAB type IC chip, a mounting substrate, and a compliant cushion for disposal between the chip and the substrate.

Turning now to FIG. 2, there is illustrated a single TAB type circuit 40 which includes an IC chip 12 that is disposed circuit side down with a back side 41 facing up on a film type lead frame 20. Lead frame 20 includes a plurality of circuit leads 42 that are connected at one end to IC chip 12. Their other ends are positioned to be bonded 1 to a plurality of bond pads 43 on multilayer thin film substrate 18 when circuit 40 is in position on the same.

A compliant cushion or pad 44 is disposed between thin film substrate 18 and chip 12. This cushion is shown in FIG. 2 as being circular in shape, but can be any shape that generally conforms to the size and shape of chip 12. As will be shown, cushion 44 is designed to be placed under a state of compression when heat sink 28 is attached to the assembly, and contacts the back side of circuit chip 12. Accordingly, cushion 44 should be made of a material, such as silicon rubber or Viton, which has a low modulus to avoid high stresses on chip 12, and is compatible with assembly, cleaning, and test processes. The thickness of cushion 44 should be such that it will be subject to no more than about 25% compression. In one experiment, a cushion thickness of 0.017 inches was successfully employed.

Figure 3:
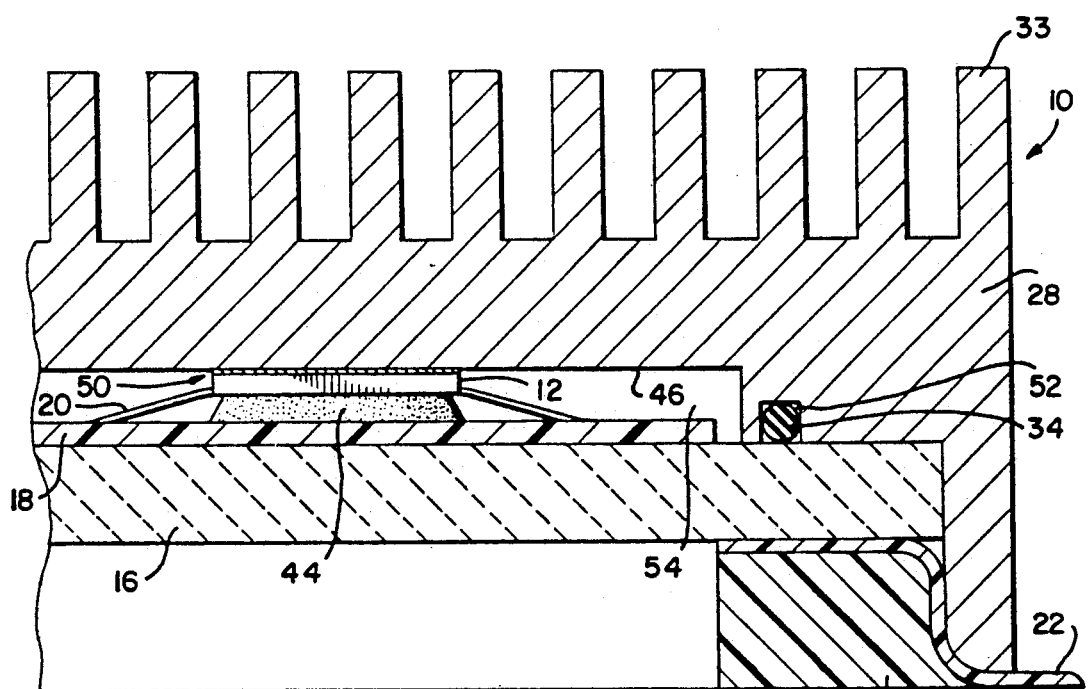
FIG. 3 is a partial cross section of the assembly.

A partial cross section of the assembled assembly 10 is illustrated in FIG. 3. As shown, heat sink 28 has an inner top surface 46 positioned to engage the back sides of the face down chips 12. Before heat sink 28 is secured to base support plate 14 and format substrate 16, however, a thin film of a non-spreading low vapor pressure dielectric fluid 50 is applied to the backsides of chips 12. This film of fluid fills in the microvoids resulting from asperity contact of the heat sink and chip mating surfaces, and thereby enhances heat transfer between the two. Both 5 and 6 ring polyphenyl ethers (PPE) have been tested for use as fluid 50, and found to perform very well. Alternatively, the thin layer of fluid 50 can be liquid metal, or a gas contained within the assembly.

The inner top surface 46 of heat sink 28 is provided with a smooth surface by standard machining methods to further assure that a low chip to heat sink thermal contact resistance is realized. Ordinarily, the surfaces of the backsides of the chips 12 already have adequate smoothness. Typically, the spacing of the non-asperity contacting surfaces of the chips and the heat sink is between 0.5 and 2.0 microns which corresponds to the required thickness of fluid film 50.

When heat sink 28 is assembled to base support plate 14 and format substrate 16 as illustrated in FIG. 3, inner top surface 46 bears down on backside of chip 12, and causes cushion 44 to slightly compress. This movement is permitted by the inherent vertical compliance of TAB type lead frame 20. In this manner, a low stress, but efficient thermal interface is achieved between heat sink 28 and circuit chip 12. The compressibility of cushion 44 compensates for minor dimensional variances that may be present in the assembly, and insures that intimate mechanical and thermal contact is maintained between each of the chips 12, and the heat sink 28. Compliant gasket 34, which is shown in FIG. 3 as being disposed in a peripheral recess 52 in the bottom of heat sink 28, serves to form a sealed enclosure 54 for the chips 12, when heat sink 28 is assembled to base support plate 14. As stated o before, this protects the chips 12 from external moisture, dirt, gases, etc.

Figure 4A:
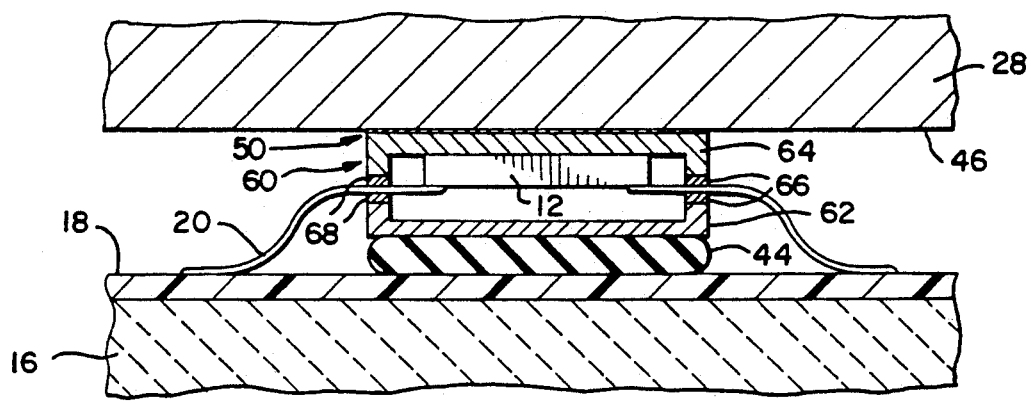
FIGS. 4A and 4B are partial cross sections of the assembly showing different types of chip housing structures.
Figure 4B:
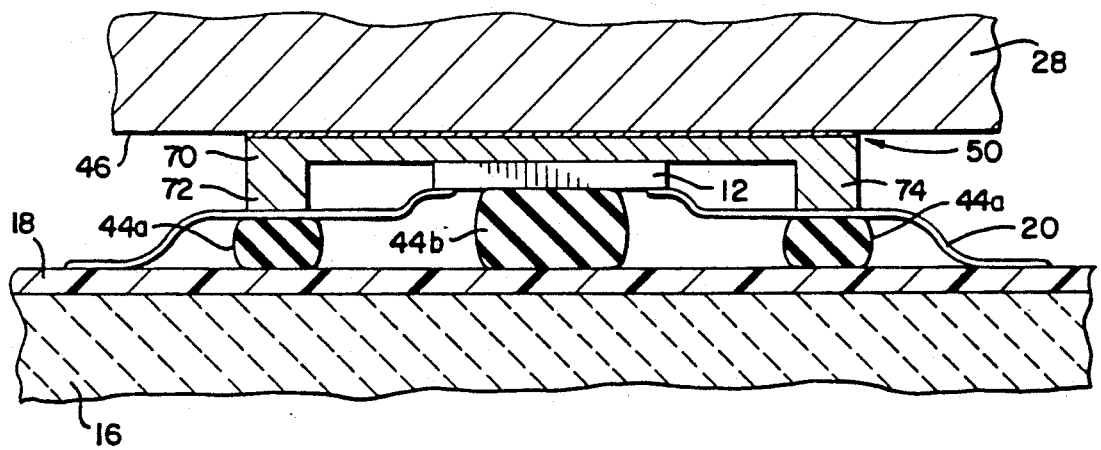

Turning now to FIGS. 4A and 4B, there are illustrated two alternative embodiments of the present invention wherein the circuit chip 12 is bonded to or contained in, an intermediate housing or structure. Specifically, in FIG. 4A, circuit chip 12 is shown contained in a clamshell housing 60, which is preferably made of high thermal conductivity ceramics and includes a lower half 62, and an upper half 64. Disposed between the mating surfaces of these two halves are seal means 66 and 68, through which, the TAB lead frame 20 of chip 12 passes. Clamshell housing 60 thus provides a sealed enclosure for chip 12.

Disposed beneath lower half 62 of clamshell 60, is the compliant cushion 44 which sits on multilayer thin film substrate 18, and format substrate 16. The top half 64 of clamshell 60 is held in intimate contact with the inner top surface 46 of heat sink 28, and as in FIG. 3, the fluid layer 50 is disposed between these two elements to improve heat transfer between them. This, combined with the fact that chip 12 is bonded to the inner surface of upper half 64, provides a good thermal path between chip 12 and heat sink 28.

The embodiment illustrated in FIG. 4B is similar, however, a heat spreader element 70 is employed in place of clamshell housing 60. Heat spreader 70 is bonded to chip 12, and its top surface is held in contact with the inner top surface 46 of heat sink 28. As with the previous embodiments, fluid layer 50 is provided between heat sink 28, and heat spreader 70.

Two compliant cushion elements, 44a and 44b, are provided: one disposed beneath chip 12, and the other disposed beneath depending legs 72 and 74 on heat spreader 70.

The embodiments illustrated in FIGS. 4A and 4B achieve the same function as the embodiment illustrated in FIG. 3, however, provide additional sealing and heat dissipation means for the chip 12 as well.

Although the invention has been illustrated in terms of a preferred embodiment, it will be understood that numerous variations and modifications can be made by those of skill in the art without departing from the true spirit and scope of the inventive concept as set forth in the following claims.

What is claimed is:

1. As assembly for packaging and cooling circuit chips comprising:
    a base;
    compliant mean disposed on said base;
    a heat sink for engagement with said base having an inner top surface; and
    a clamshell housing completely surrounding at least a first circuit chip, said clamshell housing being held in position between said compliant means and the inner top surface of said heat sink.

2. The assembly of claim 1 wherein a thin film of fluid is disposed between said clamshell housing and said heat sink to increase the thermal conductivity between the two.

3. The assembly of claim 2, wherein said fluid is a liquid.

4. The assembly of claim 3, wherein said liquid is a polyphenyl ether.

5. The assembly of claim 3, wherein said liquid is a liquid metal.

6. The assembly of claim 2, wherein said fluid is a gas.

7. The assembly of claim 1, further including seal means disposed between said heat sink and said base to form a sealed enclosure for said clamshell housing.

8. The assembly of claim 1, wherein a flexible circuit lead frame is mechanical and electrically attached at a first end to said circuit chip, extends through said clamshell housing and is attached at a second end to a plurality of bonding pads disposed on said base.

9. The assembly of claim 8, wherein said compliant means comprises a thin elastomeric cushion that is sized generally to conform to said clamshell housing, and is held in place between said clamshell housing and said base by said flexible circuit lead frame, and the pressure exerted through said clamshell housing to said cushion by the inner top surface of said heat sink.

10. The assembly of claim 1, wherein said heat sink is made of metal to act as an electromagnetic shield for said circuit chip.

11. The assembly of claim 1, wherein said clamshell housing is made of high thermal conductivity ceramic.

12. An assembly for packaging and cooling circuit chips comprising:
    a base;
    a first elastomeric cushion disposed on said base;
    at least a first circuit chip disposed with a first side on said first elastomeric cushion, and a second side facing upwardly;
    a heat spreader element bonded to said second side of said circuit chip;
    a second elastomeric cushion disposed between said heat spreader and said base; and,
    a heat sink for engagement with said base having an inner top surface to contact said heat spreader and compress said first and second elastomeric cushions so that the contact pressure, and therefore the thermal conductivity, between said inner top surface of said heat sink and said heat spreader is increased.

13. The assembly of claim 12, wherein a thin film of fluid is disposed between said heat spreader and said inner top surface of said heat sink to further increase the thermal conductivity between the two.

14. The assembly of claim 13, wherein said fluid is a liquid.

15. The assembly of claim 14, wherein said liquid is a polyphenyl ether.

16. The assembly of claim 14, wherein said liquid is a liquid metal.

17. The assembly of claim 13, wherein said fluid is a gas.

18. The assembly of claim 12, further including seal means disposed between said heat sink and said base to form a sealed enclosure for said circuit chip for protection of the circuit chip from external ambient conditions.

19. The assembly of claim 12, wherein a flexible circuit lead frame is mechanically and electrically attached at a first end to said circuit chip, and at a second end to a plurality of bonding pads disposed on said base.

20. The assembly of claim 12, wherein said heat sink is made of metal to act as an electromagnetic shield for said circuit chip.

* * * * *